(12) United States Patent
Kim et al.

(10) Patent No.: US 12,387,918 B2
(45) Date of Patent: Aug. 12, 2025

(54) SUBSTRATE PROCESSING APPARATUS AND SUBSTRATE PROCESSING METHOD

(71) Applicant: SEMES CO., LTD., Chungcheongnam-do (KR)

(72) Inventors: Minyoung Kim, Chungcheongnam-do (KR); Hanglim Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 283 days.

(21) Appl. No.: 18/332,088

(22) Filed: Jun. 9, 2023

(65) Prior Publication Data

US 2024/0006166 A1 Jan. 4, 2024

(30) Foreign Application Priority Data

Jul. 4, 2022 (KR) ........................ 10-2022-0082002

(51) Int. Cl.
*H01J 37/32* (2006.01)

(52) U.S. Cl.
CPC .. *H01J 37/32715* (2013.01); *H01J 37/32449* (2013.01); *H01J 37/32541* (2013.01)

(58) Field of Classification Search
CPC .......... H01J 37/32715; H01J 37/32449; H01J 37/32541; H01J 37/32532; H01J 37/08; H01J 37/20; H01J 37/32623; H01J 37/3244; H01J 37/32568; H01J 37/32348; H01J 2237/334; H01L 21/68764

See application file for complete search history.

(56) References Cited

U.S. PATENT DOCUMENTS

| | | | |
|---|---|---|---|
| 9,111,729 B2 | 8/2015 | Gottscho | |
| 9,835,388 B2 | 12/2017 | Gowdaru | |
| 11,339,475 B2 * | 5/2022 | Han | H10B 41/20 |

(Continued)

FOREIGN PATENT DOCUMENTS

| | | | | |
|---|---|---|---|---|
| CN | 112005336 A | * | 11/2020 | ............. C23C 16/44 |
| CN | 112889128 A | * | 6/2021 | ............ C23C 16/455 |

(Continued)

OTHER PUBLICATIONS

Translation of CN-112005336-A (Year: 2020).*

(Continued)

*Primary Examiner* — Renan Luque
(74) *Attorney, Agent, or Firm* — Carter, DeLuca & Farrell LLP

(57) ABSTRACT

Provided is a substrate processing apparatus and substrate processing method capable of processing a substrate by using plasma, the substrate processing apparatus including a process chamber providing an internal space where a substrate is processed, a spin chuck serving as a lower electrode, supporting the substrate in the internal space of the process chamber, and rotating the supported substrate, and a plasma generation unit mounted in an upper portion of the process chamber to face the spin chuck, including a discharge space where an upper electrode is provided, generating plasma by using a process gas supplied from outside, linearly ejecting the plasma onto the substrate rotated by the spin chuck, and controlling a density of the plasma to change along an extension direction of the linearly ejected plasma.

20 Claims, 12 Drawing Sheets

(56) References Cited

U.S. PATENT DOCUMENTS

| | | |
|---|---|---|
| 11,986,867 B2 | 5/2024 | Horikoshi |
| 2015/0228528 A1 | 8/2015 | Behdjat |
| 2021/0358720 A1 | 11/2021 | Lee |

FOREIGN PATENT DOCUMENTS

| | | |
|---|---|---|
| KR | 10-2012-0104222 A | 9/2012 |
| KR | 10-2014-0119726 A | 10/2014 |
| KR | 10-2016-0113724 A | 9/2016 |
| KR | 10-2021-0035736 A | 4/2021 |
| KR | 10-2021-0138401 A | 11/2021 |
| KR | 10-2338095 B | 12/2021 |
| KR | 10-2022-0006948 A | 1/2022 |

OTHER PUBLICATIONS

Translation of CN-112889128-A (Year: 2021)*
Korean Office Action issued in corresponding KR Patent Application No. 10-2022-0082002, dated Jun. 12, 2024, with English translation.
Korean Notice of Allowance issued in corresponding KR Patent Application No. 10-2022-0082002, dated Aug. 19, 2024, with English translation.

* cited by examiner

SECTION B-B

SUBSTRATE PROCESSING APPARATUS AND SUBSTRATE PROCESSING METHOD

CROSS-REFERENCE TO RELATED PATENT APPLICATION

This application claims the benefit of Korean Patent Application No. 10-2022-0082002, filed on Jul. 4, 2022, in the Korean Intellectual Property Office, the disclosure of which is incorporated herein in its entirety by reference.

BACKGROUND OF THE INVENTION

1. Field of the Invention

The present invention relates to a substrate processing apparatus and substrate processing method and, more particularly, to a substrate processing apparatus and substrate processing method capable of processing a substrate by using plasma.

2. Description of the Related Art

In general, industrially used plasma may be divided into cold plasma and thermal plasma. Cold plasma is most widely used in semiconductor manufacturing processes, and thermal plasma is used for, for example, metal cutting.

Atmospheric-pressure plasma refers to cold plasma generated by maintaining a pressure of a gas from 100 Torr to the atmospheric pressure (760 Torr) or higher. Atmospheric-pressure plasma systems, which do not use a high-priced vacuum device, are economical, require no pumping, and enable in-line processes, and thus plasma systems capable of maximizing productivity may be developed. The atmospheric-pressure plasma systems may be applied to various fields, e.g., ultra-fast etching/coating, semiconductor packaging, display devices, material surface reforming and coating, nanopowder synthesis, harmful gas removal, and oxidizing gas generation.

As an example of substrate processing apparatuses for generating atmospheric-pressure plasma, a dielectric barrier discharge (DBD)-type substrate processing apparatus illustrated in FIG. 1 may perform plasma treatment while linearly transferring a substrate S under a linear plasma generator 1 capable of generating plasma by using a process gas supplied from a gas supply line 2 and of linearly ejecting the plasma.

Although the DBD-type substrate processing apparatus may perform uniform plasma treatment on the substrate S by generating and ejecting plasma at a relatively uniform density in a length direction of an atmospheric-pressure plasma electrode, a space at least twice the area of the substrate S is required to linearly move the substrate S and thus an installation space for the substrate processing apparatus is excessively increased. In addition, when a circular substrate (e.g., a wafer) other than a rectangular substrate is processed, a portion which does not need to be processed (i.e., an outer region of the circular substrate exceeding a length of a plasma generator) is also processed and thus a transfer device under the substrate is easily corroded.

Therefore, as illustrated in FIG. 2, a substrate processing apparatus capable of capable of efficiently processing a circular substrate S without wasting a processing region in a limited space by performing plasma treatment on the substrate S positioned under a plasma generator 1 while the substrate S is being rotated by a spin chuck 3 is used. However, because the plasma generator 1 provided in a linear shape generates and ejects plasma at a uniform density in a length direction of an electrode, due to the difference in linear velocity between regions of the rotating substrate S, the uniformity of plasma treatment differs between a central portion and an edge portion of the substrate S (when the substrate S is rotated, the central portion is continuously exposed but the edge portion is periodically/repeatedly exposed to the plasma).

SUMMARY OF THE INVENTION

The present invention provides a substrate processing apparatus and substrate processing method capable of performing uniform plasma treatment on regions of a substrate by controlling a density of plasma generated by a linear plasma generator to change along a length direction of the plasma generator in consideration of the difference in linear velocity between the regions of the substrate rotated by a spin chuck. However, the above description is merely an example, and the scope of the present invention is not limited thereto.

According to an aspect of the present invention, there is provided a substrate processing apparatus including a process chamber providing an internal space where a substrate is processed, a spin chuck serving as a lower electrode, supporting the substrate in the internal space of the process chamber, and rotating the supported substrate, and a plasma generation unit mounted in an upper portion of the process chamber to face the spin chuck, including a discharge space where an upper electrode is provided, generating plasma by using a process gas supplied from outside, linearly ejecting the plasma onto the substrate rotated by the spin chuck, and controlling a density of the plasma to change along an extension direction of the linearly ejected plasma.

The plasma generation unit may linearly extend in a diameter direction of the spin chuck provided in a circular shape and generate the plasma to gradually change the density from a portion corresponding to a central portion of the substrate to a portion corresponding to an edge portion of the substrate along the extension direction of the linearly ejected plasma.

The plasma generation unit may generate the plasma to gradually increase the density from the portion corresponding to the central portion of the substrate to the portion corresponding to the edge portion of the substrate in consideration of an linear velocity of the substrate rotated by the spin chuck.

The plasma generation unit may include a reactor body including the discharge space and provided in a hollow bar shape linearly extending in the diameter direction of the circular spin chuck, and the upper electrode mounted in the discharge space of the reactor body and provided in a rod shape linearly extending in the diameter direction of the spin chuck.

The reactor body may include a nozzle provided in a bottom surface of the reactor body in a slit shape along the diameter direction to linearly eject the plasma generated in the discharge space onto a surface of the substrate supported by the spin chuck.

The plasma generation unit may extend longer than a diameter of the spin chuck to pass through a rotation axis of the spin chuck rotatably supporting the substrate and cross an entirety of the spin chuck in the diameter direction.

The spin chuck may include a top surface concavely provided with a certain curvature to gradually decrease a distance between the spin chuck and the plasma generation unit from the portion corresponding to the central portion of the substrate to the portion corresponding to the edge portion of the substrate supported by the spin chuck.

The spin chuck may include three or more support pins disposed at equal angles in radial directions from the rotation axis to support the substrate at three or more points of the top surface concavely provided with the certain curvature.

The spin chuck may be divided into a plurality of electrodes including a central electrode provided in a cylindrical shape around the rotation axis of the spin chuck, a first edge electrode provided in a ring shape around the rotation axis to surround the central electrode, and a second edge electrode provided in a ring shape around the rotation axis to surround the first edge electrode.

The central electrode, the first edge electrode, and the second edge electrode of the spin chuck may be individually raised or lowered to differently control distances between top surfaces of the plurality of electrodes and the plasma generation unit.

The spin chuck may be raised or lowered in such a manner that the top surface of the first edge electrode is higher than the top surface of the central electrode and the top surface of the second edge electrode is higher than the top surface of the first edge electrode, in order to gradually decrease the distance between the spin chuck and the plasma generation unit from the portion corresponding to the central portion of the substrate to the portion corresponding to the edge portion of the substrate supported by the spin chuck.

The plasma generation unit may extend longer than a radius of the spin chuck to cross a half of the spin chuck in the diameter direction from the rotation axis of the spin chuck rotatably supporting the substrate.

The upper electrode may be provided in a rod shape linearly extending in the discharge space of the reactor body and having a cross-sectional area gradually changing along an extension direction of the upper electrode to exhibit a trapezoidal shape when viewed from above.

The upper electrode may have a cross-sectional area gradually decreasing from the portion corresponding to the central portion of the substrate to the portion corresponding to the edge portion of the substrate supported by the spin chuck.

The plasma generation unit may be inclined at a certain angle with respect to a top surface of the spin chuck.

The plasma generation unit may be inclined to gradually decrease a distance between the plasma generation unit and the substrate from the portion corresponding to the central portion of the substrate to the portion corresponding to the edge portion of the substrate supported by the spin chuck.

The upper electrode may be provided in a rod shape having a circular cross section and having an outer circumferential surface surrounded by an insulator.

The discharge space of the reactor body may have an annular cross section due to the rod-shaped upper electrode mounted in the discharge space.

According to another aspect of the present invention, there is provided a substrate processing method including a) a substrate rotation step for seating and then rotating a substrate on a spin chuck rotatably mounted in an internal space of a process chamber where the substrate is processed, and b) a substrate processing step for, through a plasma generation unit mounted in an upper portion of the process chamber to face the spin chuck, including a discharge space where an upper electrode is provided, and generating plasma by using a process gas supplied from outside, linearly ejecting the plasma onto the substrate rotated by the spin chuck, and controlling a density of the plasma to change along an extension direction of the linearly ejected plasma.

According to another aspect of the present invention, there is provided a substrate processing apparatus including a process chamber providing an internal space where a substrate is processed, a spin chuck serving as a lower electrode, supporting the substrate in the internal space of the process chamber, and rotating the supported substrate, a plasma generation unit mounted in an upper portion of the process chamber to face the spin chuck, including a discharge space where an upper electrode is provided, generating plasma by using a process gas supplied from outside, and treating a surface of the substrate with the plasma, and a controller for controlling a flow rate of the process gas supplied from a process gas supply unit to the plasma generation unit, wherein the plasma generation unit linearly extends in a diameter direction of the spin chuck provided in a circular shape, linearly ejects the plasma onto the substrate rotated by the spin chuck, controls a density of the plasma to gradually increase from a portion corresponding to a central portion of the substrate to a portion corresponding to an edge portion of the substrate in consideration of an linear velocity of the substrate rotated by the spin chuck, and includes a reactor body including the discharge space and provided in a hollow bar shape linearly extending in the diameter direction of the circular spin chuck, and the upper electrode mounted in the discharge space of the reactor body and provided in a rod shape linearly extending in the diameter direction of the spin chuck, and wherein the reactor body includes a nozzle provided in a bottom surface of the reactor body in a slit shape along the diameter direction to linearly eject the plasma generated in the discharge space onto a surface of the substrate supported by the spin chuck.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
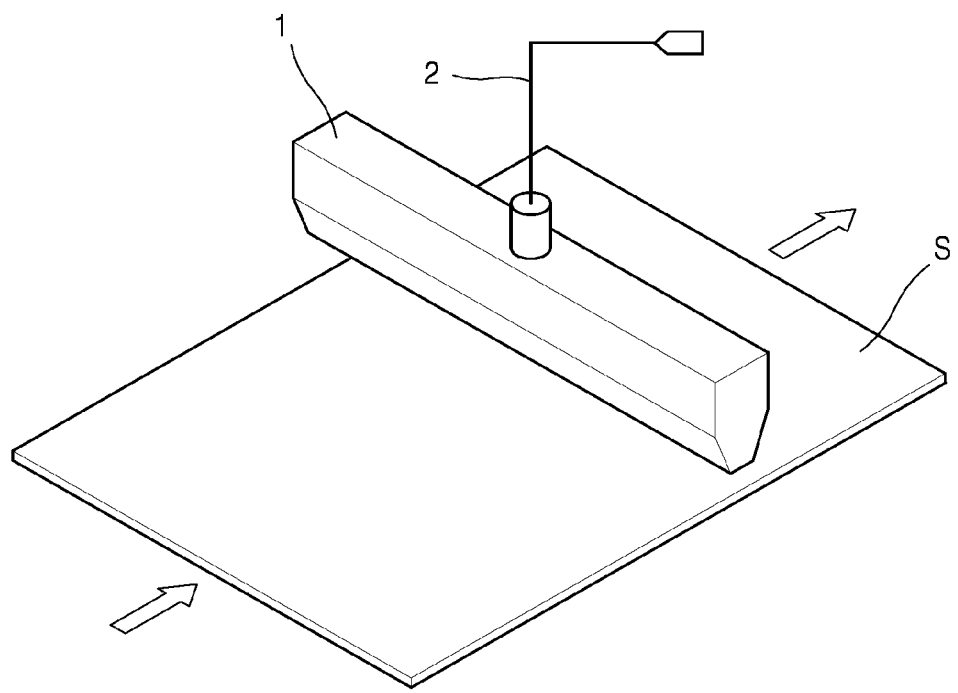
FIGS. 1 and 2 are perspective views of general substrate processing apparatuses.
Figure 2:
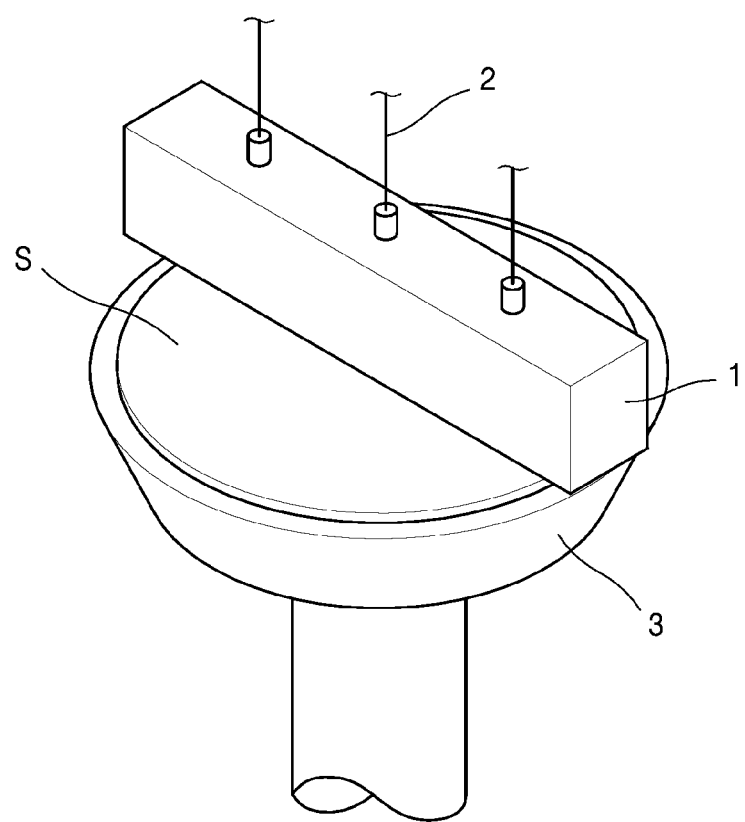

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 3:
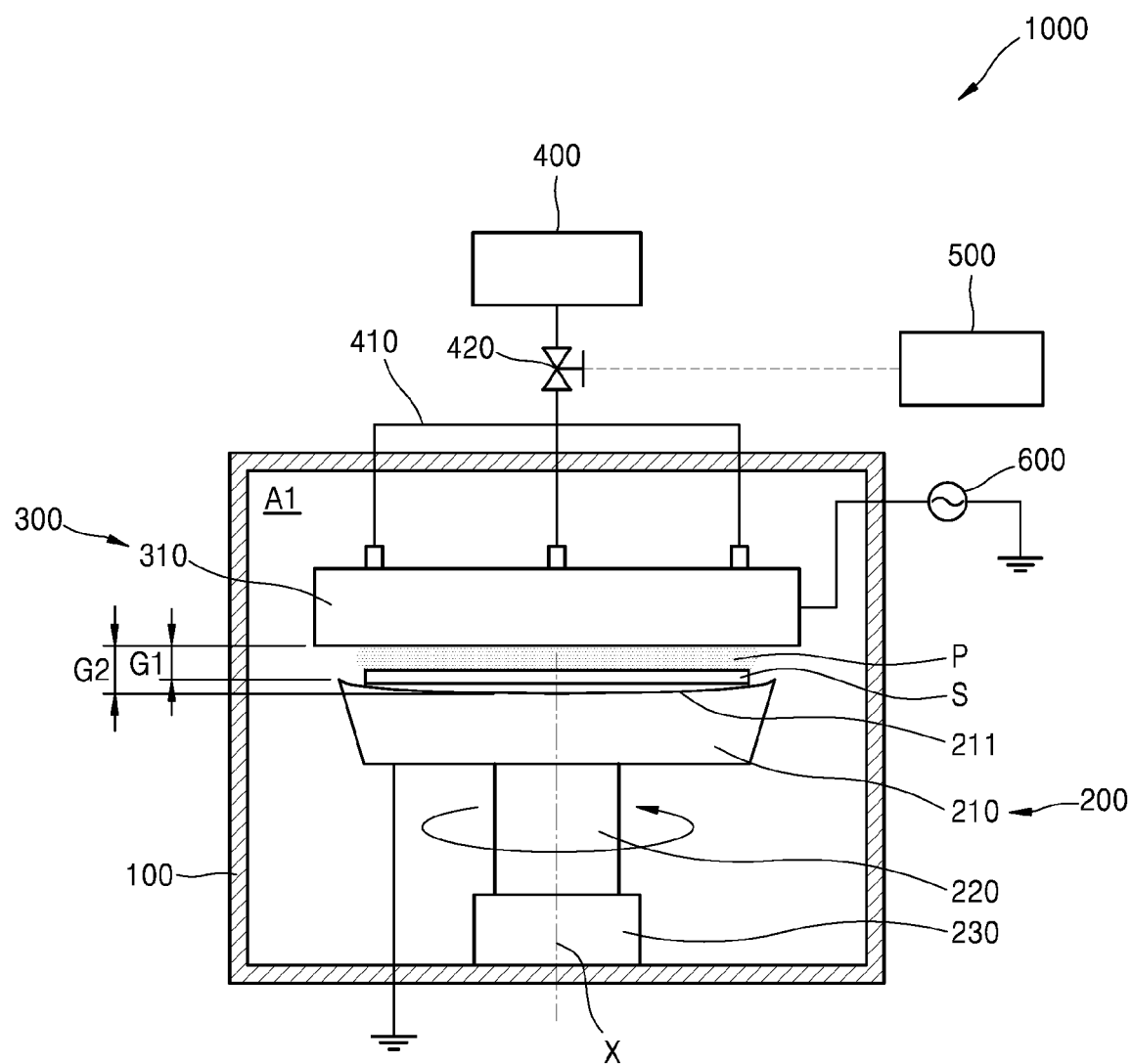
FIG. 3 is a cross-sectional view of a substrate processing apparatus according to an embodiment of the present invention.
Figure 4:
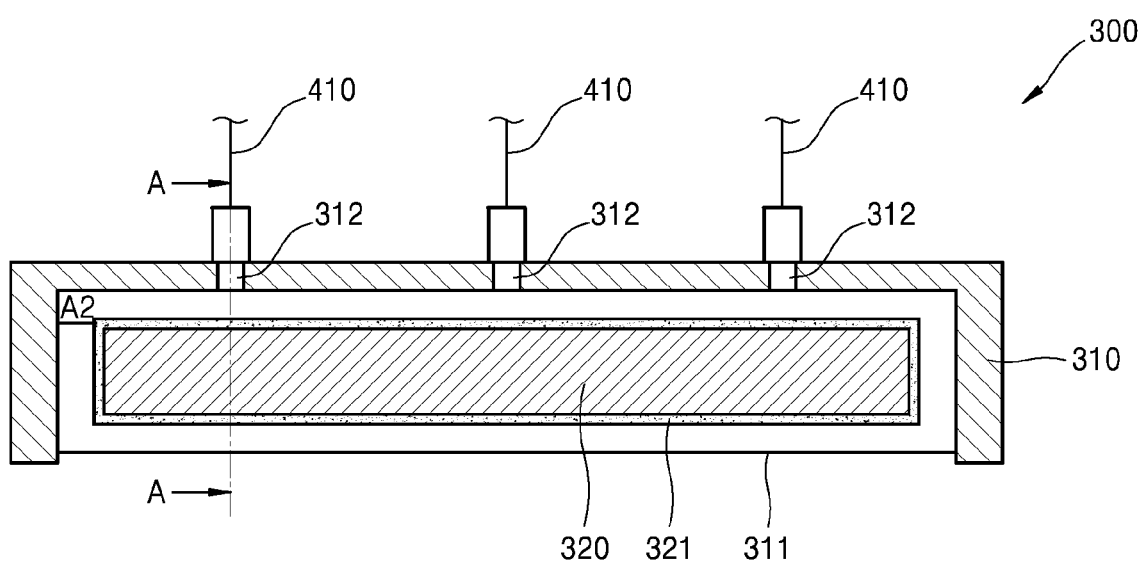
FIG. 4 is a cross-sectional view of a plasma generation unit of the substrate processing apparatus of FIG. 3.
Figure 5:
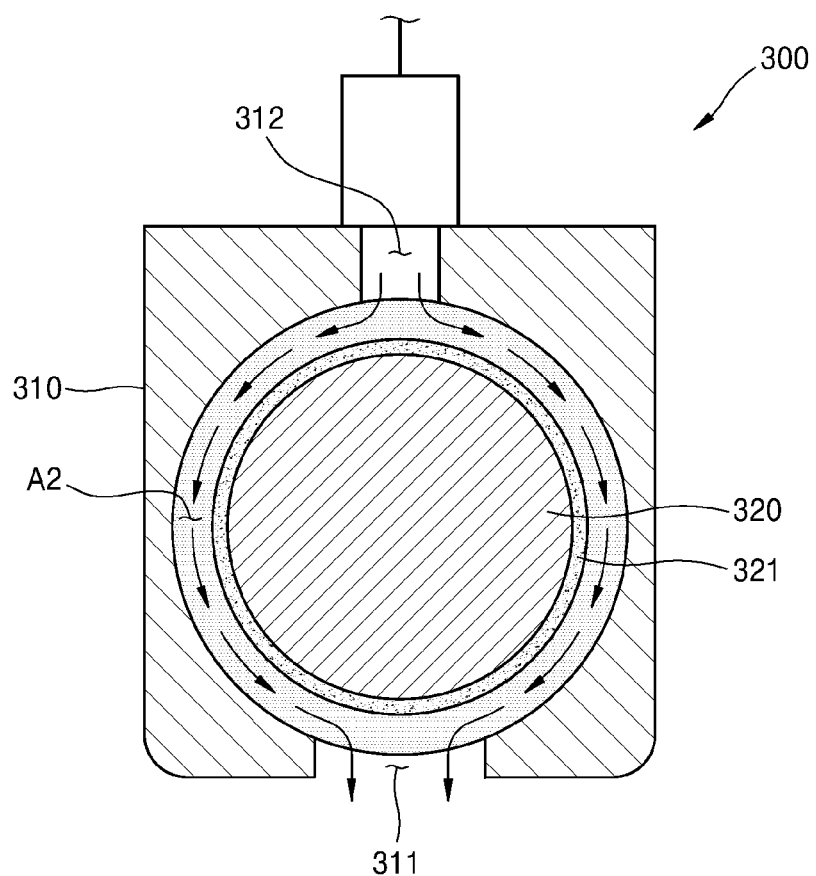
FIG. 5 is a cross-sectional view taken along line A-A of FIG. 4.
Figure 6:
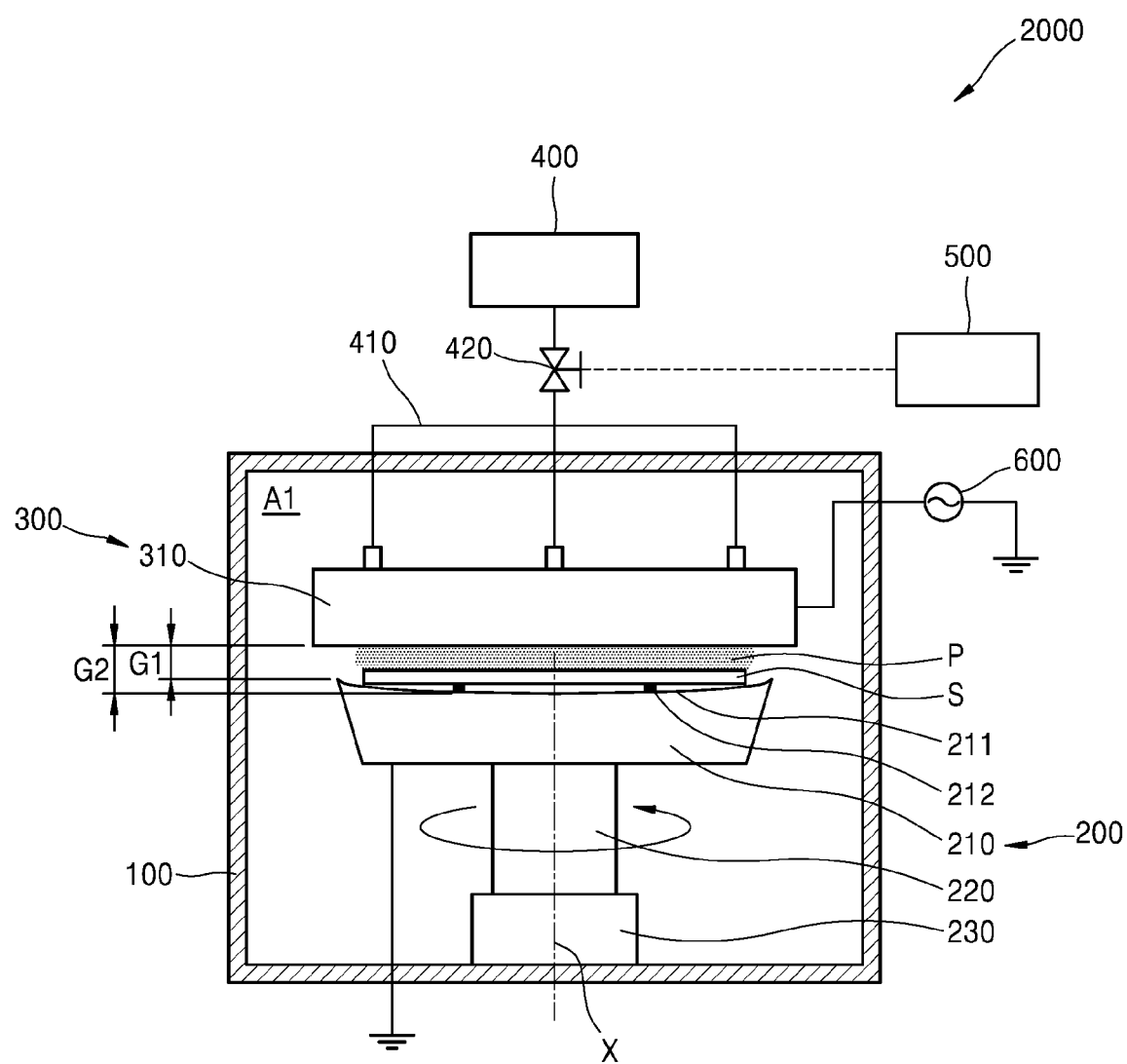
FIG. 6 is a cross-sectional view of a substrate processing apparatus according to another embodiment of the present invention.
Figure 7:
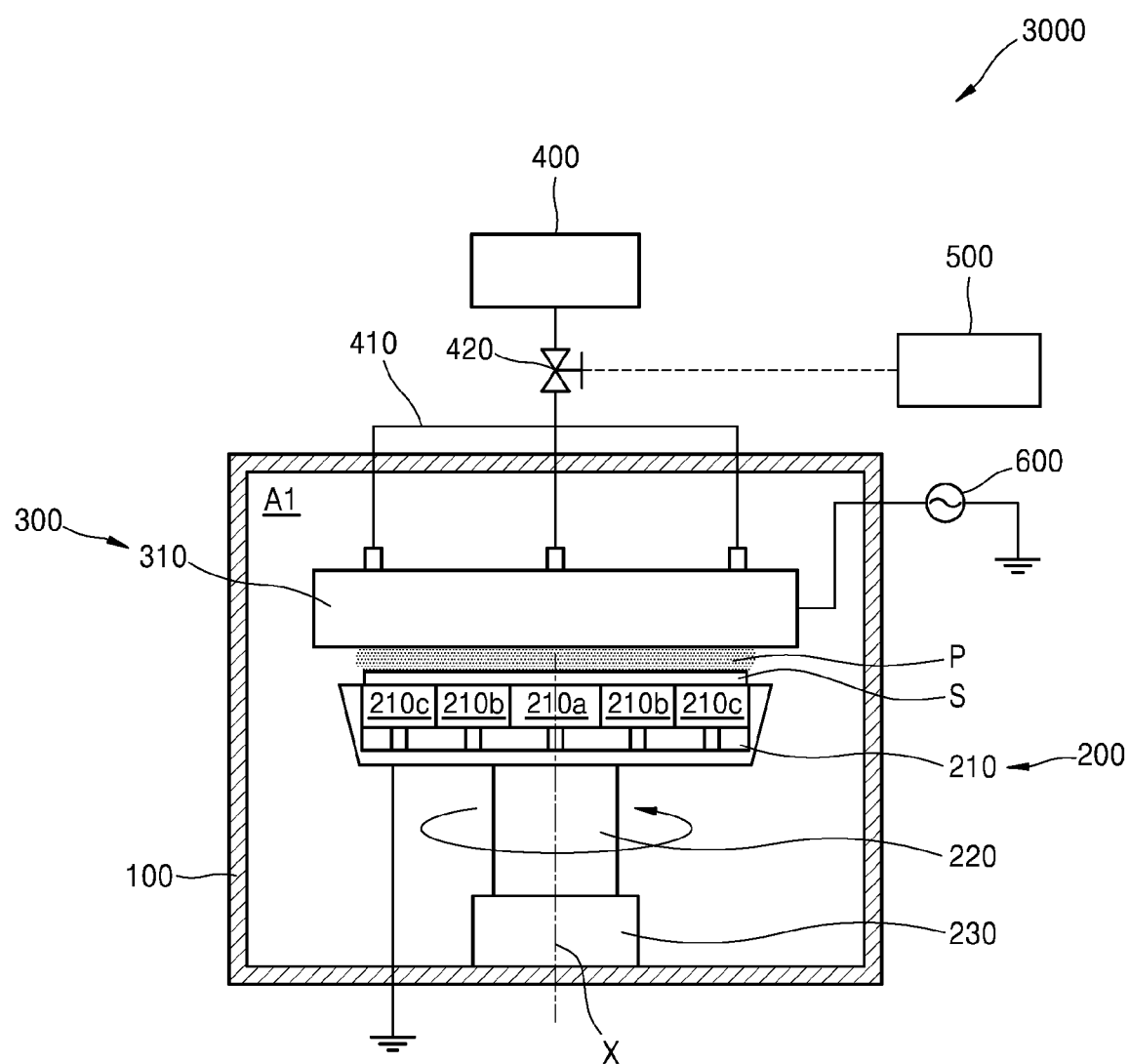
FIGS. 7 and 8 are cross-sectional views of a substrate processing apparatus according to another embodiment of the present invention.
Figure 8:
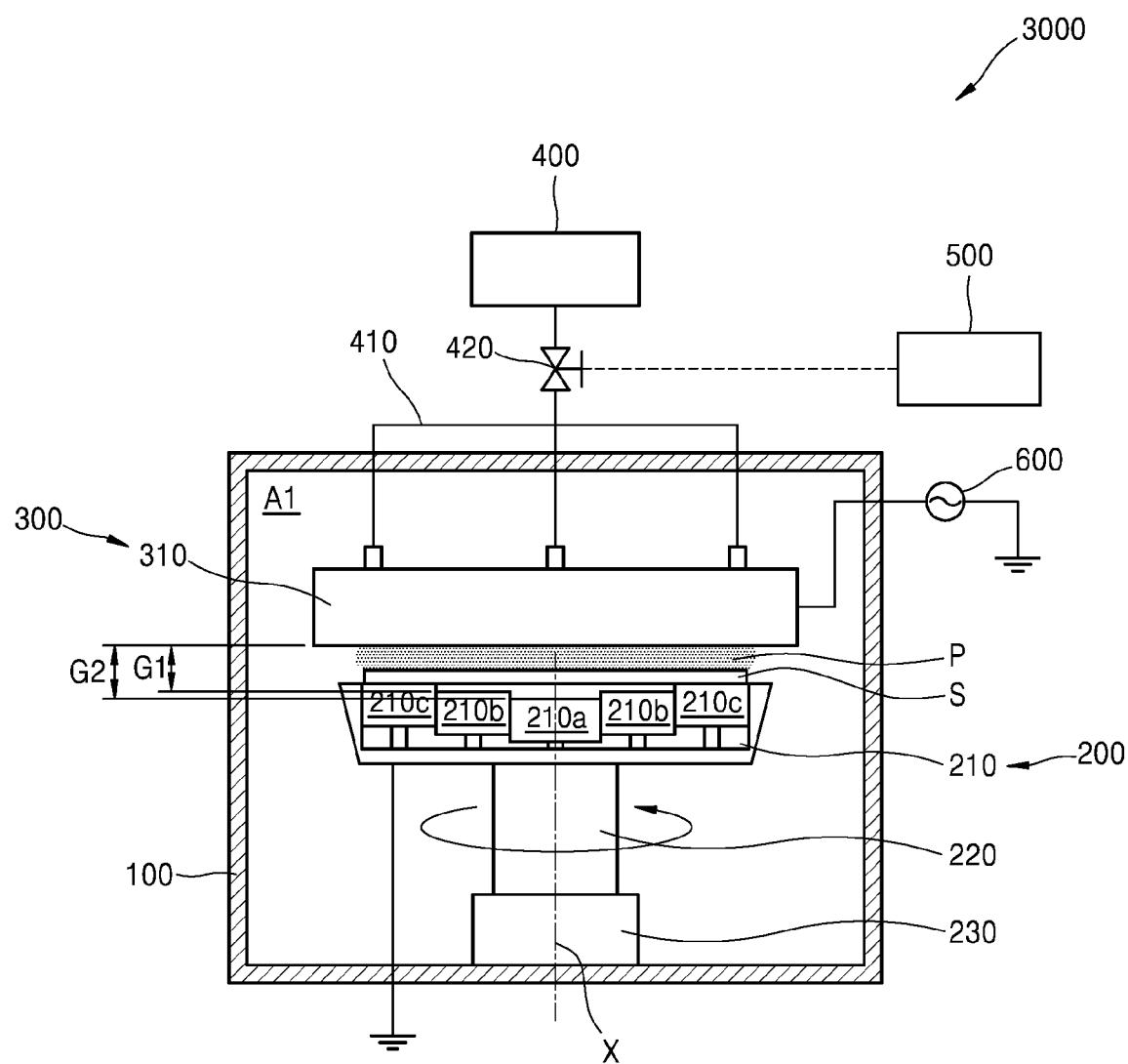
Figure 9:
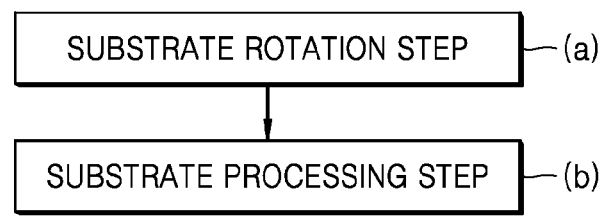
FIG. 9 is a flowchart of a substrate processing method according to another embodiment of the present invention.
Figure 10:
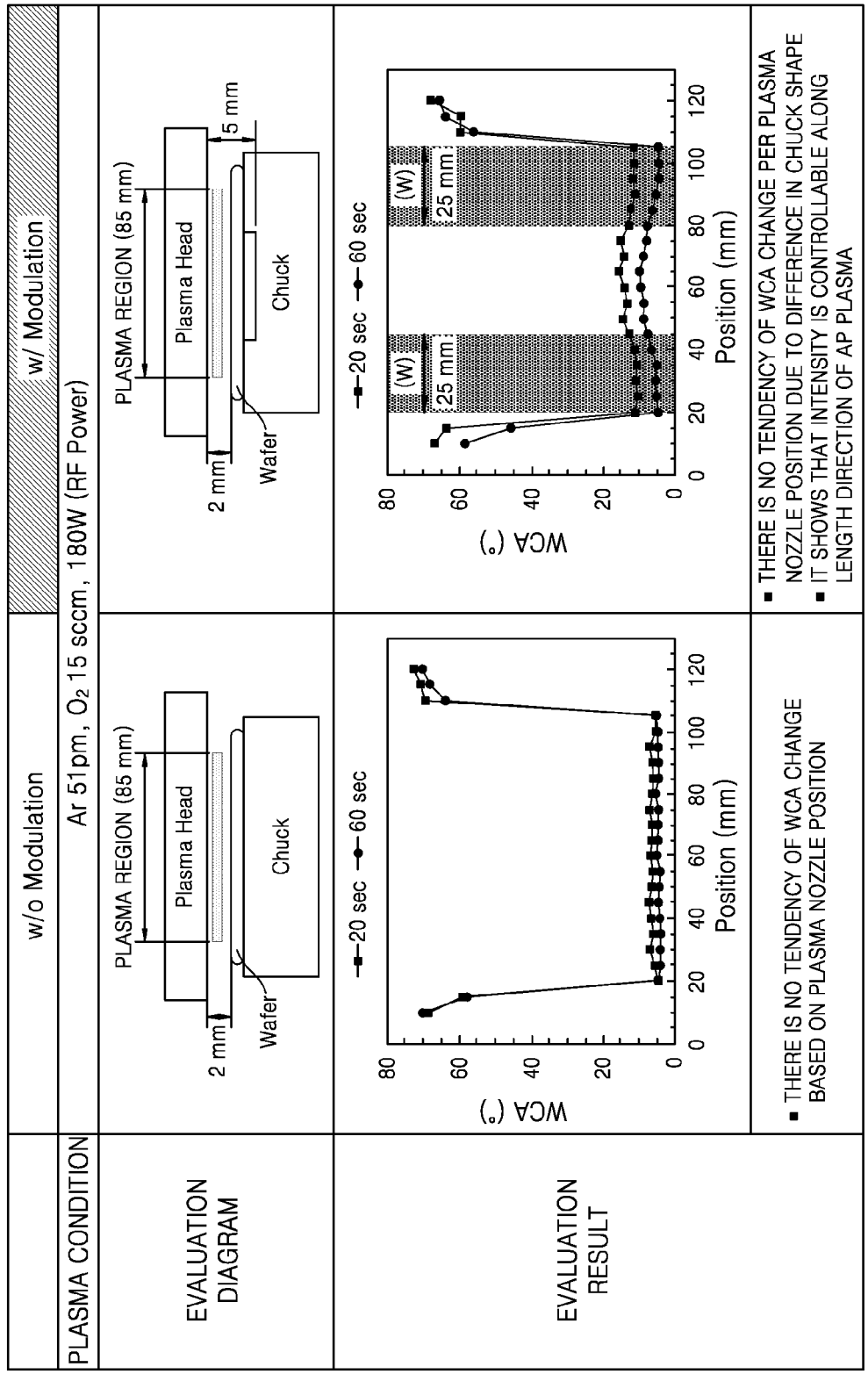
FIG. 10 is a table showing a test result about changes in water contact angle (WCA) of a substrate based on changes in distance between a plasma generation unit and a lower electrode.

FIG. 3 is a cross-sectional view of a substrate processing apparatus 1000 according to an embodiment of the present invention, FIG. 4 is a cross-sectional view of a plasma generation unit 300 of the substrate processing apparatus 1000 of FIG. 3, and FIG. 5 is a cross-sectional view taken along line A-A of FIG. 4. FIG. 6 is a cross-sectional view of a substrate processing apparatus 2000 according to another embodiment of the present invention, FIGS. 7 and 8 are cross-sectional views of a substrate processing apparatus 3000 according to another embodiment of the present invention, FIG. 9 is a flowchart of a substrate processing method according to another embodiment of the present invention, and FIG. 10 is a table showing a test result about changes in water contact angle (WCA) of a substrate S based on changes in distance between the plasma generation unit 300 and a lower electrode (e.g., a spin chuck 200).

As illustrated in FIG. 3, the substrate processing apparatus 1000 according to an embodiment of the present invention is an apparatus capable of performing a series of plasma surface treatments on the substrate S for semiconductor devices by using atmospheric-pressure plasma P, and may mainly include a process chamber 100, the spin chuck 200, the plasma generation unit 300, a process gas supply unit 400, and a controller 500.

For example, the substrate processing apparatus 1000 according to an embodiment of the present invention may perform a cleaning process for removing organic substances (i.e., impurities) remaining on the surface of the substrate S, or an ashing process for stripping a photoresist pattern from and passivating the surface of the substrate S.

As illustrated in FIG. 3, the process chamber 100 may provide an internal space A1 where the substrate S is processed. Specifically, the process chamber 100 may include the internal space A1 provided at atmospheric pressure in a circular, rectangular, or polygonal shape, and plasma treatment may be performed on the substrate S positioned in the internal space A1 by the spin chuck 200 to be described below. A gate (not shown) that may be opened or closed by a valve may be provided on a side surface of the process chamber 100 to load or unload the substrate S into or from the internal space A1.

As illustrated in FIG. 3, the spin chuck 200 serves as a lower electrode and may support the substrate S in the internal space A1 of the process chamber 100 and rotate the supported substrate S while the substrate S is being treated with the plasma P ejected from the plasma generation unit 300 to be described below.

Specifically, the spin chuck 200 may be a chuck including a spin head 210 having a circular top surface and made of anodized aluminum (A1) to be used as a lower electrode. As such, the substrate S may be fixed onto the spin head 210 by electrostatic force, by vacuum force, or by chuck pins provided on the spin head 210.

A support shaft 220 supporting the spin head 210 may be connected to the bottom of the spin head 210 of the spin chuck 200 and rotated by a driver 230 connected to the bottom of the support shaft 220. The driver 230 may be provided as a motor or the like.

As such, the support shaft 220 may be rotated by the rotation of the driver 230 and thus the spin head 210 and the substrate S seated on a top surface 211 thereof may also be rotated. In this case, the spin head 210 may be provided to be grounded such that it may be used as a lower electrode. For example, the spin head 210 itself may serve as a lower electrode, or a lower electrode may be embedded in the spin head 210.

As illustrated in FIG. 3, the plasma generation unit 300 may be mounted in an upper portion of the process chamber 100 to face the spin chuck 200, include a discharge space A2 where an upper electrode 320 is provided, generate the plasma P by using a process gas supplied from the outside, and linearly eject the plasma P onto the substrate S rotated by the spin chuck 200 to treat the surface of the substrate S with the plasma P.

For example, the plasma generation unit 300 may linearly extend in a diameter direction of the spin chuck 200 provided in a circular shape, linearly eject the plasma P onto the substrate S rotated by the spin chuck 200, and control a density of the plasma P to gradually increase from a portion corresponding to a central portion of the substrate S to a portion corresponding to an edge portion of the substrate S along an extension direction of the linearly ejected plasma P in consideration of the difference in linear velocity between regions of the substrate S rotated by the spin chuck 200.

As illustrated in FIGS. 3 to 5, the plasma generation unit 300 may include a reactor body 310 including the discharge space A2 and provided in a hollow bar shape linearly extending in the diameter direction of the circular spin chuck 200, and the upper electrode 320 mounted in the discharge space A2 of the reactor body 310 and provided in a rod shape linearly extending in the diameter direction of the spin chuck 200, and the reactor body 310 may include a nozzle 311 provided in a bottom surface of the reactor body 310 in a slit shape along the diameter direction to linearly eject the plasma P generated in the discharge space A2 onto the surface of the substrate S supported by the spin chuck 200.

Specifically, the reactor body 310 of the plasma generation unit 300 may be provided in a cuboid bar shape parallel to the substrate S supported by the top surface 211 of the spin head 210 of the spin chuck 200, and extend longer than a diameter of the spin chuck 200 to pass through a rotation axis X of the spin chuck 200 rotatably supporting the substrate S and cross the entirety of the spin chuck 200 in the diameter direction.

As described above, the reactor body 310 may be provided in a hollow cuboid bar shape including an empty space, and the bottom surface thereof may be opened by the slit-shaped nozzle 311. The empty space of the reactor body 310 may have the upper electrode 320 mounted therein to serve as the discharge space A2 where the plasma P is generated. In this case, the reactor body 310 may be grounded.

At least one supply port 312 for supplying the process gas into the discharge space A2 may be provided on the reactor body 310. In this case, a gas supply line 410 connected to the external process gas supply unit 400 may be connected to each supply port 312. Herein, although three supply ports 312 of the reactor body 310 are illustrated in FIGS. 3 and 4, the number of supply ports 312 is not limited thereto and various numbers of supply ports 312 may be provided to appropriately supply the process gas in consideration of a volume of the discharge space A2.

In this case, a flow rate of the process gas supplied from the process gas supply unit 400 to the plasma generation unit 300 may be controlled by the controller 500. Specifically, the controller 500 may be electrically connected to a valve 420 on the gas supply line 410 and control the valve 420 to adjust the flow rate of the process gas passing through the valve 420.

The nozzle 311 provided in a slit shape in the bottom surface of the reactor body 310 may be connected to the discharge space A2 to linearly eject the plasma P generated in the discharge space A2 toward the substrate S supported by the spin head 210. In this case, the nozzle 311 may extend longer than a diameter of the substrate S.

As illustrated in FIG. 4, the upper electrode 320 of the plasma generation unit 300 may be mounted to extend along the discharge space A2 in the reactor body 310. For example, as illustrated in FIG. 5, the upper electrode 320 may be provided in a rod shape having a circular cross section and having an outer circumferential surface surrounded by an insulator 321 having an annular cross section, such that the discharge space A2 of the reactor body 310 may have an annular cross section due to the rod-shaped upper electrode 320 mounted therein.

Although not shown in the drawings, the upper electrode 320 may be provided with a channel through which a refrigerant flows to suppress heating caused by plasma generation.

Specifically, the upper electrode 320 may be made of copper (Cu) or Cu alloy having low electrical resistance and high thermal conductivity to minimize heating caused by discharge. The insulator 321 may be made of quartz ($SiO_2$), alumina, alumina compound, or the like capable of suppressing heating caused by discharge and having durability against the plasma P.

As such, the upper electrode 320 may excite the process gas supplied into the discharge space A2 of the reactor body 310, into the plasma P by using high-frequency power applied from a high-frequency power source 600.

As described above, in order to control the density of the plasma P generated by the upper electrode 320 mounted in the discharge space A2 of the reactor body 310 of the plasma generation unit 300 to change along an extension direction of the linear plasma generation unit 300, a distance between the upper electrode 320 and the top surface 211 of the spin head 210 of the spin chuck 200 serving as a lower electrode may be controlled to change along the extension direction of the plasma generation unit 300.

As illustrated in FIG. 3, the top surface 211 of the spin head 210 of the spin chuck 200 may be concavely provided with a certain curvature with respect to the rotation axis X to gradually nonlinearly decrease the distance between the spin chuck 200 and the plasma generation unit 300 from a second gap G2 at the portion corresponding to the central portion of the substrate S to a first gap G1 at the portion corresponding to the edge portion of the substrate S supported by the top surface 211. For example, to ensure the uniformity of plasma treatment on the substrate S by changing the shape of the spin head 210 serving as a lower ground electrode while the upper electrode 320 for generating atmospheric-pressure plasma is positioned to cover the entirety of the diameter of the substrate S to be processed, the substrate processing apparatus 1000 of the present invention may provide the top surface 211 of the spin head 210 in a concave shape having a certain curvature to control the density of the plasma P by using a simple structure based on the difference in distance between the ground electrode and the atmospheric-pressure plasma source electrode provided above the ground electrode.

As such, uniform plasma treatment may be performed on regions of the substrate S rotated by the spin chuck 200 by controlling the density of the plasma P generated by the linear plasma generation unit 300 to change along a length direction of the plasma generation unit 300 (e.g., by controlling the density of the plasma P to gradually increase from the portion corresponding to the central portion of the substrate S to the portion corresponding to the edge portion of the substrate S) in consideration of the difference in linear velocity between the regions of the substrate S rotated by the spin chuck 200 (when the substrate S is rotated, the central portion having a relatively low linear velocity may be exposed to the plasma P for a long time but the time exposed to the plasma P may decrease toward the edge portion having a relatively high linear velocity).

In this case, to effectively satisfy the difference in density of the plasma P which is required differently depending on a rotation speed and a diameter of the substrate S rotated by the spin chuck 200, a plurality of spin heads 210 including top surfaces 211 concavely provided with different curvatures may be prepared and the spin head 210 may be appropriately replaced as needed.

In addition, the spin chuck 200 may be provided in a wide variety of shapes to control the density of the plasma P based on the difference in distance between the ground electrode and the atmospheric-pressure plasma source electrode provided above the ground electrode.

For example, as in the substrate processing apparatus 2000 according to another embodiment of the present invention, which is illustrated in FIG. 6, the spin head 210 of the spin chuck 200 may include three or more support pins 212 disposed at equal angles in radial directions from the rotation axis X to support the substrate S at three or more points where the top surface 211 concavely provided with the certain curvature is spaced apart from the substrate S.

Specifically, due to the concave top surface 211 of the spin head 210 supporting the substrate S, because only the edge portion of the substrate S is supported by the top surface 211 of the spin head 210 in a ring shape and a region other than the edge portion is spaced apart from the top surface 211 of the spin head 210, when the diameter of the substrate S increases, the central portion of the substrate S not supported by the top surface 211 of the spin head 210 may sag.

As such, as illustrated in FIG. 6, by providing three or more support pins 212 on the concave top surface 211 of the spin head 210, the central portion of the substrate S not supported by the top surface 211 may be supported and the sagging of the central portion of the substrate S may be prevented even when the diameter of the substrate S increases.

As in the substrate processing apparatus 3000 according to another embodiment of the present invention, which is illustrated in FIG. 7, the spin head 210 of the spin chuck 200 serving as a lower electrode may be divided into a plurality of electrodes.

For example, the spin head 210 of the spin chuck 200 may include a central electrode 210a provided in a cylindrical shape around the rotation axis X of the spin chuck 200, a first edge electrode 210b provided in a ring shape around the rotation axis X to surround the central electrode 210a, and a second edge electrode 210c provided in a ring shape around the rotation axis X to surround the first edge electrode 210b, and the central electrode 210a, the first edge electrode 210b, and the second edge electrode 210c may be individually raised or lowered to differently control distances between top surfaces of the plurality of electrodes and the plasma generation unit 300.

Specifically, the central electrode 210a, the first edge electrode 210b, and the second edge electrode 210c may be individually raised or lowered by driving cylinders (not shown) such as hydraulic cylinders, pneumatic cylinders, or electric cylinders.

As such, as illustrated in FIG. 8, the spin head 210 of the spin chuck 200 may be raised or lowered in such a manner that the top surface of the first edge electrode 210b is higher than the top surface of the central electrode 210a and the top surface of the second edge electrode 210c is higher than the top surface of the first edge electrode 210b, in order to gradually decrease the distance between the spin chuck 200 and the plasma generation unit 300 from the second gap G2 at the portion corresponding to the central portion of the substrate S to the first gap G1 at the portion corresponding to the edge portion of the substrate S supported by the spin head 210.

As described above, by appropriately controlling the heights of the electrodes 210a, 210b, and 210c in consideration of the difference in density of the plasma P which is required differently depending on a rotation speed and a diameter of the substrate S rotated by the spin chuck 200, various types of the difference in density of the plasma P may be implemented without replacing the spin head 210.

Herein, although the spin head 210 is divided into three electrodes such as the central electrode 210a, the first edge electrode 210b, and the second edge electrode 210c in FIGS. 7 and 8, the spin head 210 is not limited thereto and may be divided into various numbers of electrodes as needed depending on a process.

A substrate processing method using the above-described substrate processing apparatus 1000, 2000, or 3000 will now be described in detail.

For example, as shown in FIG. 9, the substrate processing method according to an embodiment of the present invention may be performed in the order of a) a substrate rotation step and b) a substrate processing step.

Specifically, in step a), the substrate S may be seated and then rotated on the spin chuck 200 rotatably mounted in the internal space A1 of the process chamber 100 where the substrate S is processed. Then, in step b), through the plasma generation unit 300 mounted in the upper portion of the process chamber 100 to face the spin chuck 200, including the discharge space A2 where the upper electrode 320 is provided, and generating the plasma P by using the process gas supplied from the outside, the plasma P is linearly ejected onto the substrate S rotated by the spin chuck 200 and the density of the plasma P is controlled to change along the extension direction of the linearly ejected plasma P. As such, uniform plasma treatment may be performed on regions of the substrate S by controlling the density of the plasma P to gradually increase from the portion corresponding to the central portion of the substrate S to the portion corresponding to the edge portion of the substrate S in consideration of the difference in linear velocity between the regions of the substrate S rotated by the spin chuck 200.

FIG. 10 is a table showing a test result about the influence of changes in distance between a source electrode (i.e., the upper electrode 320) and a ground electrode or lower electrode (i.e., the spin head 210) on an effect of processing an object (i.e., the substrate S), and shows changes in WCA measured after the object is exposed to plasma ejected from the source electrode for a certain period of time.

As shown in the test result of FIG. 10, the WCA of the object does not exhibit any changes when the lower ground electrode does not change in shape, but exhibits changes based on the changes in distance between the source electrode and the ground electrode when the lower ground electrode changes in shape.

Therefore, in the substrate processing apparatuses 1000, 2000, and 3000 according to various embodiments of the present invention and the substrate processing method using the same, the circular substrate S may be efficiently processed without wasting a processing region in a limited space by performing plasma treatment on the substrate S positioned under the plasma generation unit 300 while the substrate S is being rotated by the spin chuck 200 without moving the substrate S for the plasma treatment.

In addition, uniform plasma treatment may be performed on regions of the substrate S by controlling the density of the plasma P generated by the linear plasma generation unit 300 to change along the length direction of the plasma generation unit 300 in consideration of the difference in linear velocity between the regions of the substrate S rotated by the spin chuck 200.

Figure 11:
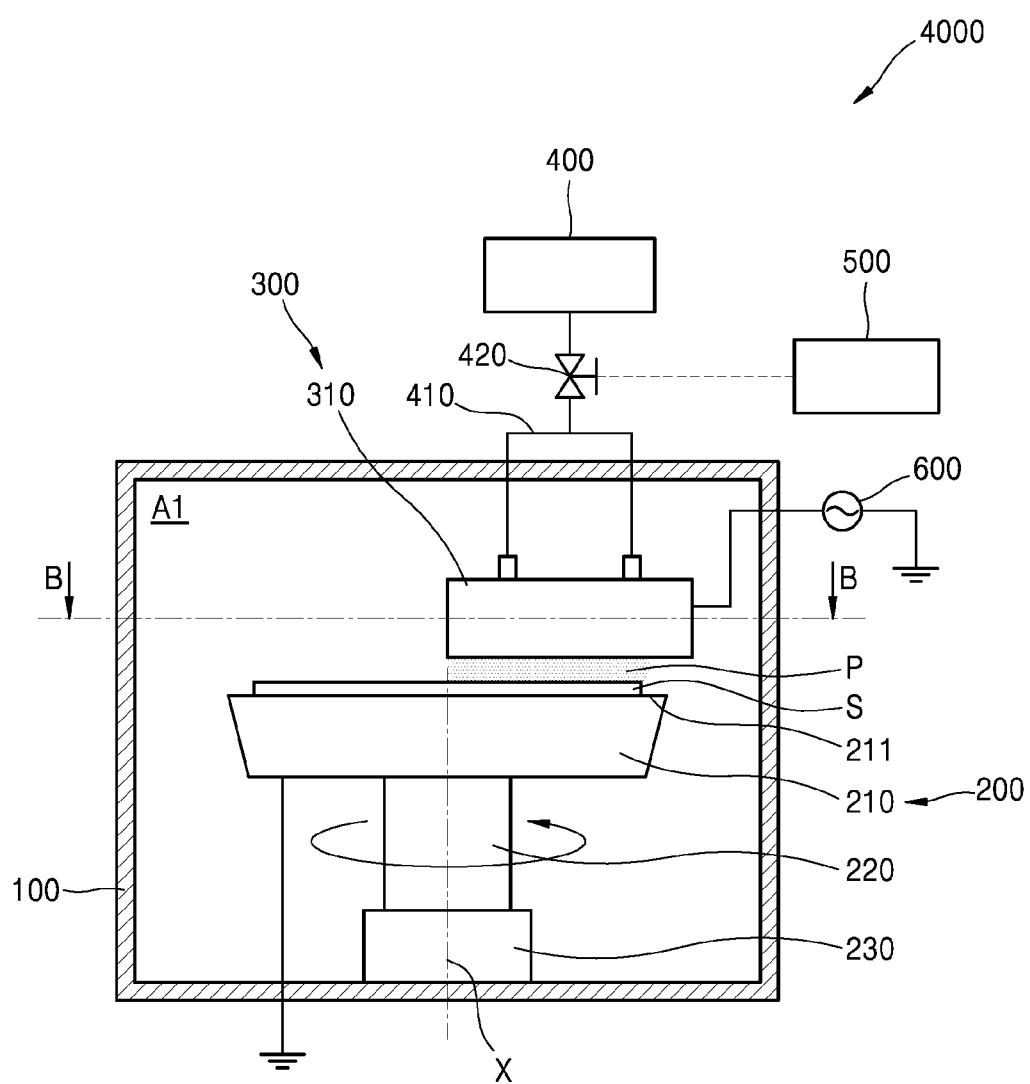
FIG. 11 is a cross-sectional view of a substrate processing apparatus according to another embodiment of the present invention.
Figure 12:
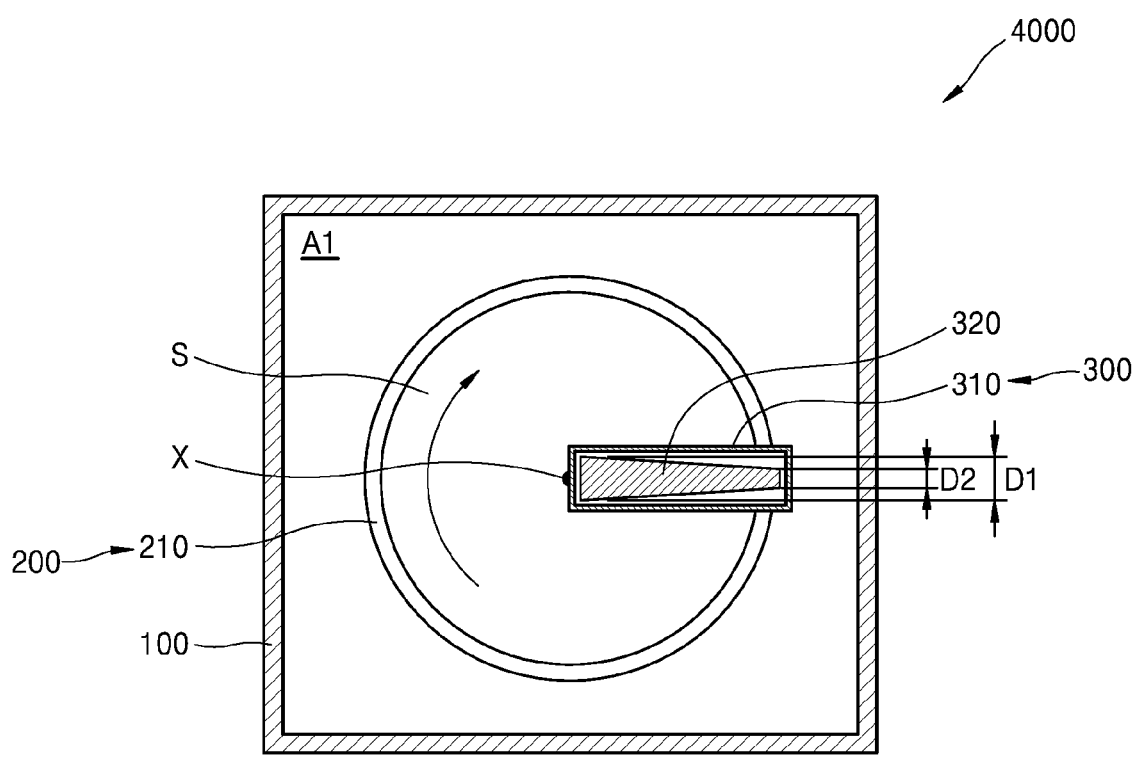
FIG. 12 is a cross-sectional view taken along line B-B of FIG. 11.
Figure 13:
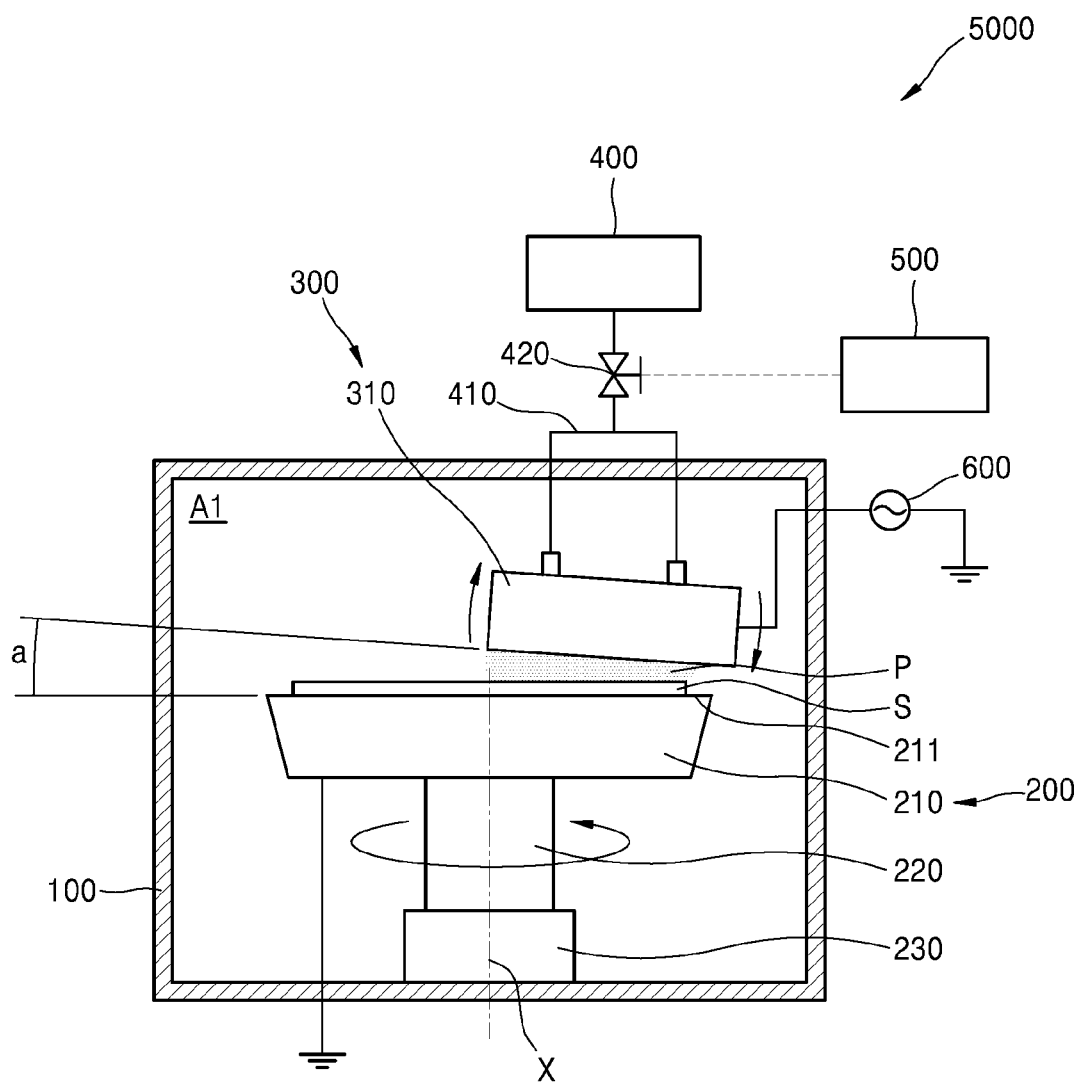
FIG. 13 is a cross-sectional view of a substrate processing apparatus according to another embodiment of the present invention.

FIG. 11 is a cross-sectional view of a substrate processing apparatus 4000 according to another embodiment of the present invention, and FIG. 12 is a cross-sectional view taken along line B-B of FIG. 11. FIG. 13 is a cross-sectional view of a substrate processing apparatus 5000 according to another embodiment of the present invention.

As illustrated in FIG. 11, the plasma generation unit 300 of the substrate processing apparatus 4000 according to another embodiment of the present invention may extend longer than a radius of the spin chuck 200 to cross a half of the spin chuck 200 in the diameter direction from the rotation axis X of the spin chuck 200 rotatably supporting the substrate S.

In this case, as illustrated in FIG. 12, the upper electrode 320 of the plasma generation unit 300 may be provided in a rod shape linearly extending in the discharge space A2 of the reactor body 310 and having a cross-sectional area gradually changing along an extension direction thereof to exhibit a trapezoidal shape when viewed from above.

Specifically, the upper electrode 320 may be provided in a rod shape having a first diameter D1 at an end corresponding to the central portion of the substrate S, having a second diameter D2 less than the first diameter D1 at another end corresponding to the edge portion of the substrate S, and including an outer circumferential surface inclined to have a cross-sectional area gradually changing along an extension direction thereof. As such, the upper electrode 320 may have a cross-sectional area gradually decreasing from the portion corresponding to the central portion of the substrate S to the portion corresponding to the edge portion of the substrate S supported by the spin chuck 200.

For example, the substrate processing apparatus 4000 according to another embodiment of the present invention uses a method of performing plasma treatment on the substrate S by positioning the upper electrode 320 only above a half of the substrate S with respect to the center of the substrate S rotated by the spin chuck 200 (i.e., the rotation axis X), and may control plasma treatment on the central portion and the edge portion of the substrate S to be performed at a uniform intensity by changing the upper electrode 320 from a normal rectangular shape to a trapezoidal shape and positioning a shorter base of the trapezoidal shape (relatively high-density plasma is generated due to a small cross-sectional area) as the portion corresponding to the edge portion of the substrate S.

In addition, as in the substrate processing apparatus 5000 according to another embodiment of the present invention, which is illustrated in FIG. 13, the plasma generation unit 300 may extend longer than a radius of the spin chuck 200 to cross a half of the spin chuck 200 in the diameter direction from the rotation axis X of the spin chuck 200 rotatably supporting the substrate S, the upper electrode 320 may be provided in a normal rectangular shape, and the plasma generation unit 300 may be inclined at a certain angle a with respect to the top surface 211 of the spin head 210.

Specifically, the plasma generation unit 300 may be inclined at the certain angle a to gradually decrease a distance between the plasma generation unit 300 and the substrate S from the portion corresponding to the central portion of the substrate S to the portion corresponding to the edge portion of the substrate S supported by the spin chuck 200, i.e., to be inclined downward from the portion corresponding to the central portion of the substrate S to the portion corresponding to the edge portion of the substrate S.

Due to the inclination of the plasma generation unit 300, because the density of the plasma P is low at the central portion of the substrate S where the distance is large and gradually increases toward the edge portion of the substrate S where the distance is small, uniform plasma treatment may be performed on regions of the substrate S rotated by the spin chuck 200 in consideration of the difference in linear velocity between the regions of the substrate S rotated by the spin chuck 200 (when the substrate S is rotated, the central portion having a relatively low linear velocity may be exposed to the plasma P for a long time but the time exposed to the plasma P may decrease toward the edge portion having a relatively high linear velocity).

Therefore, in the substrate processing apparatuses 4000 and 5000 according to various embodiments of the present invention, the circular substrate S may be efficiently processed without wasting a processing region in a limited space by performing plasma treatment on the substrate S positioned under the plasma generation unit 300 while the substrate S is being rotated by the spin chuck 200 without moving the substrate S for the plasma treatment.

In addition, uniform plasma treatment may be performed on regions of the substrate S by controlling the density of the plasma P generated by the linear plasma generation unit 300 to change along the length direction of the plasma generation unit 300 in consideration of the difference in linear velocity between the regions of the substrate S rotated by the spin chuck 200.

According to the afore-described embodiments of the present invention, a substrate processing apparatus and substrate processing method capable of efficiently processing a circular substrate without wasting a processing region in a limited space by performing plasma treatment on the substrate positioned under a plasma generator while the substrate is being rotated by a spin chuck without moving the substrate for the plasma treatment, and of performing uniform plasma treatment on regions of the substrate by controlling a density of plasma generated by the linear plasma generator to change along a length direction of the plasma generator in consideration of the difference in linear velocity between the regions of the substrate rotated by the spin chuck may be implemented. However, the scope of the present invention is not limited to the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate processing apparatus comprising:
   a process chamber providing an internal space where a substrate is processed;
   a spin chuck serving as a lower electrode, supporting the substrate in the internal space of the process chamber, and rotating the supported substrate; and
   a plasma generation unit mounted in an upper portion of the process chamber to face the spin chuck, comprising a discharge space where an upper electrode is provided, generating plasma by using a process gas supplied from outside, linearly ejecting the plasma onto the substrate rotated by the spin chuck, and controlling a density of the plasma to change along an extension direction of the linearly ejected plasma.

2. The substrate processing apparatus of claim 1, wherein the plasma generation unit linearly extends in a diameter direction of the spin chuck provided in a circular shape and generates the plasma to gradually change the density from a portion corresponding to a central portion of the substrate to a portion corresponding to an edge portion of the substrate along the extension direction of the linearly ejected plasma.

3. The substrate processing apparatus of claim 2, wherein the plasma generation unit generates the plasma to gradually increase the density from the portion corresponding to the central portion of the substrate to the portion corresponding to the edge portion of the substrate in consideration of a linear velocity of the substrate rotated by the spin chuck.

4. The substrate processing apparatus of claim 2, wherein the plasma generation unit comprises:
   a reactor body comprising the discharge space and provided in a hollow bar shape linearly extending in the diameter direction of the circular spin chuck; and
   the upper electrode mounted in the discharge space of the reactor body and provided in a rod shape linearly extending in the diameter direction of the spin chuck.

5. The substrate processing apparatus of claim 4, wherein the reactor body comprises a nozzle provided in a bottom surface of the reactor body in a slit shape along the diameter direction to linearly eject the plasma generated in the discharge space onto a surface of the substrate supported by the spin chuck.

6. The substrate processing apparatus of claim 4, wherein the plasma generation unit extends longer than a diameter of the spin chuck to pass through a rotation axis of the spin chuck rotatably supporting the substrate and cross an entirety of the spin chuck in the diameter direction.

7. The substrate processing apparatus of claim 6, wherein the spin chuck comprises a top surface concavely provided with a certain curvature to gradually decrease a distance between the spin chuck and the plasma generation unit from the portion corresponding to the central portion of the substrate to the portion corresponding to the edge portion of the substrate supported by the spin chuck.

8. The substrate processing apparatus of claim 7, wherein the spin chuck comprises three or more support pins disposed at equal angles in radial directions from the rotation axis to support the substrate at three or more points of the top surface concavely provided with the certain curvature.

9. The substrate processing apparatus of claim 6, wherein the spin chuck is divided into a plurality of electrodes comprising:
a central electrode provided in a cylindrical shape around the rotation axis of the spin chuck;
a first edge electrode provided in a ring shape around the rotation axis to surround the central electrode; and
a second edge electrode provided in a ring shape around the rotation axis to surround the first edge electrode.

10. The substrate processing apparatus of claim 9, wherein the central electrode, the first edge electrode, and the second edge electrode of the spin chuck are individually raised or lowered to differently control distances between top surfaces of the plurality of electrodes and the plasma generation unit.

11. The substrate processing apparatus of claim 10, wherein the spin chuck is raised or lowered in such a manner that the top surface of the first edge electrode is higher than the top surface of the central electrode and the top surface of the second edge electrode is higher than the top surface of the first edge electrode, in order to gradually decrease the distance between the spin chuck and the plasma generation unit from the portion corresponding to the central portion of the substrate to the portion corresponding to the edge portion of the substrate supported by the spin chuck.

12. The substrate processing apparatus of claim 4, wherein the plasma generation unit extends longer than a radius of the spin chuck to cross a half of the spin chuck in the diameter direction from the rotation axis of the spin chuck rotatably supporting the substrate.

13. The substrate processing apparatus of claim 12, wherein the upper electrode is provided in a rod shape linearly extending in the discharge space of the reactor body and having a cross-sectional area gradually changing along an extension direction of the upper electrode to exhibit a trapezoidal shape when viewed from above.

14. The substrate processing apparatus of claim 13, wherein the upper electrode has a cross-sectional area gradually decreasing from the portion corresponding to the central portion of the substrate to the portion corresponding to the edge portion of the substrate supported by the spin chuck.

15. The substrate processing apparatus of claim 12, wherein the plasma generation unit is inclined at a certain angle with respect to a top surface of the spin chuck.

16. The substrate processing apparatus of claim 15, wherein the plasma generation unit is inclined to gradually decrease a distance between the plasma generation unit and the substrate from the portion corresponding to the central portion of the substrate to the portion corresponding to the edge portion of the substrate supported by the spin chuck.

17. The substrate processing apparatus of claim 4, wherein the upper electrode is provided in a rod shape having a circular cross section and having an outer circumferential surface surrounded by an insulator.

18. The substrate processing apparatus of claim 17, wherein the discharge space of the reactor body has an annular cross section due to the rod-shaped upper electrode mounted in the discharge space.

19. A substrate processing method comprising:
a) a substrate rotation step for seating and then rotating a substrate on a spin chuck rotatably mounted in an internal space of a process chamber where the substrate is processed; and
b) a substrate processing step for, through a plasma generation unit mounted in an upper portion of the process chamber to face the spin chuck, comprising a discharge space where an upper electrode is provided, and generating plasma by using a process gas supplied from outside, linearly ejecting the plasma onto the substrate rotated by the spin chuck, and controlling a density of the plasma to change along an extension direction of the linearly ejected plasma.

20. A substrate processing apparatus comprising:
a process chamber providing an internal space where a substrate is processed;
a spin chuck serving as a lower electrode, supporting the substrate in the internal space of the process chamber, and rotating the supported substrate;
a plasma generation unit mounted in an upper portion of the process chamber to face the spin chuck, comprising a discharge space where an upper electrode is provided, generating plasma by using a process gas supplied from outside, and treating a surface of the substrate with the plasma;
a process gas supply unit supplying the process gas to the plasma generation unit; and
a controller for controlling a flow rate of the process gas supplied from the process gas supply unit to the plasma generation unit,
wherein the plasma generation unit linearly extends in a diameter direction of the spin chuck provided in a circular shape, linearly ejects the plasma onto the substrate rotated by the spin chuck, controls a density of the plasma to gradually increase from a portion corresponding to a central portion of the substrate to a portion corresponding to an edge portion of the substrate in consideration of an linear velocity of the substrate rotated by the spin chuck, and comprises:
a reactor body comprising the discharge space and provided in a hollow bar shape linearly extending in the diameter direction of the circular spin chuck; and
the upper electrode mounted in the discharge space of the reactor body and provided in a rod shape linearly extending in the diameter direction of the spin chuck, and
wherein the reactor body comprises a nozzle provided in a bottom surface of the reactor body in a slit shape along the diameter direction to linearly eject the plasma generated in the discharge space onto a surface of the substrate supported by the spin chuck.

* * * * *